US005694053A

United States Patent [19]

Smith

[11] Patent Number: 5,694,053

[45] Date of Patent: Dec. 2, 1997

[54] DISPLAY MATRIX TESTER

[75] Inventor: Donald Leonard Smith, Palo Alto, Calif.

[73] Assignee: Xerox Corporation, Stamford, Conn.

[21] Appl. No.: 698,823

[22] Filed: Aug. 16, 1996

Related U.S. Application Data

[63] Continuation of Ser. No. 473,912, Jun. 7, 1995, abandoned.

[51] Int. Cl.$^6$ .......... G01R 31/02; G01R 31/00

[52] U.S. Cl. .......... 324/770; 324/501

[58] Field of Search .......... 324/770, 500, 324/501, 538, 658, 750, 753; 345/87

[56] References Cited

U.S. PATENT DOCUMENTS

| | | | |
|---|---|---|---|
| 4,983,911 | 1/1991 | Henley | 324/770 |
| 5,006,788 | 4/1991 | Goulette et al. | 324/750 |
| 5,124,660 | 6/1992 | Cilingiroglu | 324/538 |
| 5,179,345 | 1/1993 | Jenkins et al. | 324/658 |
| 5,258,705 | 11/1993 | Okamoto et al. | 324/770 |
| 5,377,030 | 12/1994 | Suzuki et al. | 324/770 |
| 5,424,633 | 6/1995 | Soiferman | 324/538 |
| 5,432,461 | 7/1995 | Henley | 324/770 |
| 5,459,409 | 10/1995 | Henley | 324/770 |
| 5,532,615 | 7/1996 | Kondo et al. | 324/770 |

OTHER PUBLICATIONS

Photon Dynamics, Inc. In Process Tester User's Manual 1.2, Apr. 1993, pp. 1-1 thru 1-12.

*Primary Examiner*—Ernest F. Karlsen
*Attorney, Agent, or Firm*—Oliff & Berridge

[57] ABSTRACT

A testing device tests devices having a matrix of signal generators or sensors. The testing device uses a test plate having a plurality of signal generators or sensors arranged in a pattern matching the matrix of sensors or signal generators on the device to be tested. Individual signal generators or sensors on the test plate are electromagnetically coupled to a corresponding signal generator or sensor on the device to be tested. The signal generators or sensors on the test plate produce a pattern of signals or sense signals output by the device to be tested. Comparison of the signals output or sensed by the testing device to the signals output or sensed by the device to be tested indicates if the device to be tested is operating properly. A particular testing device is provided for testing the matrix of display electrodes in an active matrix liquid crystal display before liquid crystal processing of the display is completed. Charge-sensing electrodes of the testing device sense charges on corresponding display electrodes which are driven in accordance with a test image. A sensed image is generated based on the charges sensed by the charge-sensing electrodes. A comparison of the test image to the sensed image indicates if the matrix of display electrodes is working properly.

6 Claims, 6 Drawing Sheets

DISPLAY MATRIX TESTER

This is a continuation of application Ser. No. 08/473,912 filed Jun. 7, 1995, now abandoned.

BACKGROUND OF THE INVENTION

1. Field of the Invention

This invention relates to testing an active-matrix display plate or other device having a matrix of electrodes or sensors. In particular, this invention relates to testing an active-matrix liquid crystal display before completing the liquid crystal and the cover plate assembly.

2. Description of Related Art

Active-matrix liquid crystal displays and other devices having a matrix of display electrodes, sensors or other electronic devices are generally tested once processing of the display or other device is completed. For example, the operation of a liquid crystal display is usually fully tested once the display is completely assembled. During testing, the liquid crystal display is driven by a display pattern generator to display a test image. An operator, who is familiar with how the test image should appear, inspects the image displayed by the liquid crystal display to determine if the display is operating properly. This type of testing is called post-processing testing since the display is fully assembled at the time of testing.

The liquid crystal display includes display electrodes, switches, gate lines and data lines, which cooperate to activate the pixels in the display. However, post-processing testing detects defects in these elements only after the liquid crystal display is fully assembled. Because assembling a liquid crystal display is complicated, repair of the faulty display electrodes, switches, data lines or gate lines after the display is fully assembled is time-consuming and expensive. To make such repairs, the display must be disassembled, the faulty component must be identified and repaired, and the display must be re-assembled.

Currently, some manufacturers of liquid crystal displays perform limited testing of the display electrodes, the switches, the data lines and the gate lines in the display before final processing of the display is completed. This testing is limited to testing the continuity of the data and the gate lines and does not include actuating the switches and driving the display electrodes. Testing the continuity of the data and the gate lines in the liquid crystal display is time-consuming and tedious since the display can have many thousands of data and gate lines and the data and gate lines are typically spaced approximately 80 microns apart.

A device manufactured by Photon Dynamics tests the operation of the switches and the display electrodes in the liquid crystal display before full assembly of the liquid crystal display is completed. This device places an electro-optic crystal a few microns above the display electrodes in the display. The switches and the display electrodes are then addressed by a display pattern generator and charges are placed on specific display electrodes based on a test image. Charges on the specific display electrodes affect the index of refraction of the crystal at points near the specific display electrodes. This change in index of refraction is detected by a scanning device. By detecting the areas in the crystal which have altered indicies of refraction, the testing device can determine which specific display electrodes are activated. This information is then used to determine if the display electrodes are working properly. This testing system is, however, quite complicated in operation and expensive.

Therefore, a relatively inexpensive testing device is required which enables quick and easy testing of the operation of a liquid crystal display before completing the final assembly of the display.

SUMMARY OF THE INVENTION

This invention provides a device which is capable of quickly and easily testing the performance of an active-matrix display plate before liquid crystal processing and final assembly is completed.

The invention also provides a device which identifies the faulty display electrodes, switches, data lines or gate lines in an active-matrix liquid crystal display and enables repair of the faulty components while avoiding the need to assemble, disassemble and reassemble the display.

The invention operates to capacitively couple a charge-sensing electrode to each of the display electrodes in the liquid crystal display. Each display electrode corresponds to a pixel in the display. The display electrodes are driven by a display pattern generator to each produce an electric field or other electric signal based on a test image. The capacitively-coupled charge-sensing electrodes detect the electric field or other electric signal produced by the corresponding display electrodes and output a sensed signal. A test signal analyzer generates a sensed image from the sensed signals output by the charge-sensing electrodes and compares the sensed image to the test image. By comparing the test image to the sensed image, the test signal analyzer can quickly and easily determine which display electrodes are not functioning properly.

BRIEF DESCRIPTION OF THE DRAWINGS

Specific embodiments of the invention will be described with reference to the following figures, in which like reference numerals identify like elements and wherein.

DETAILED DESCRIPTION OF THE PREFERRED EMBODIMENTS

Figure 1:
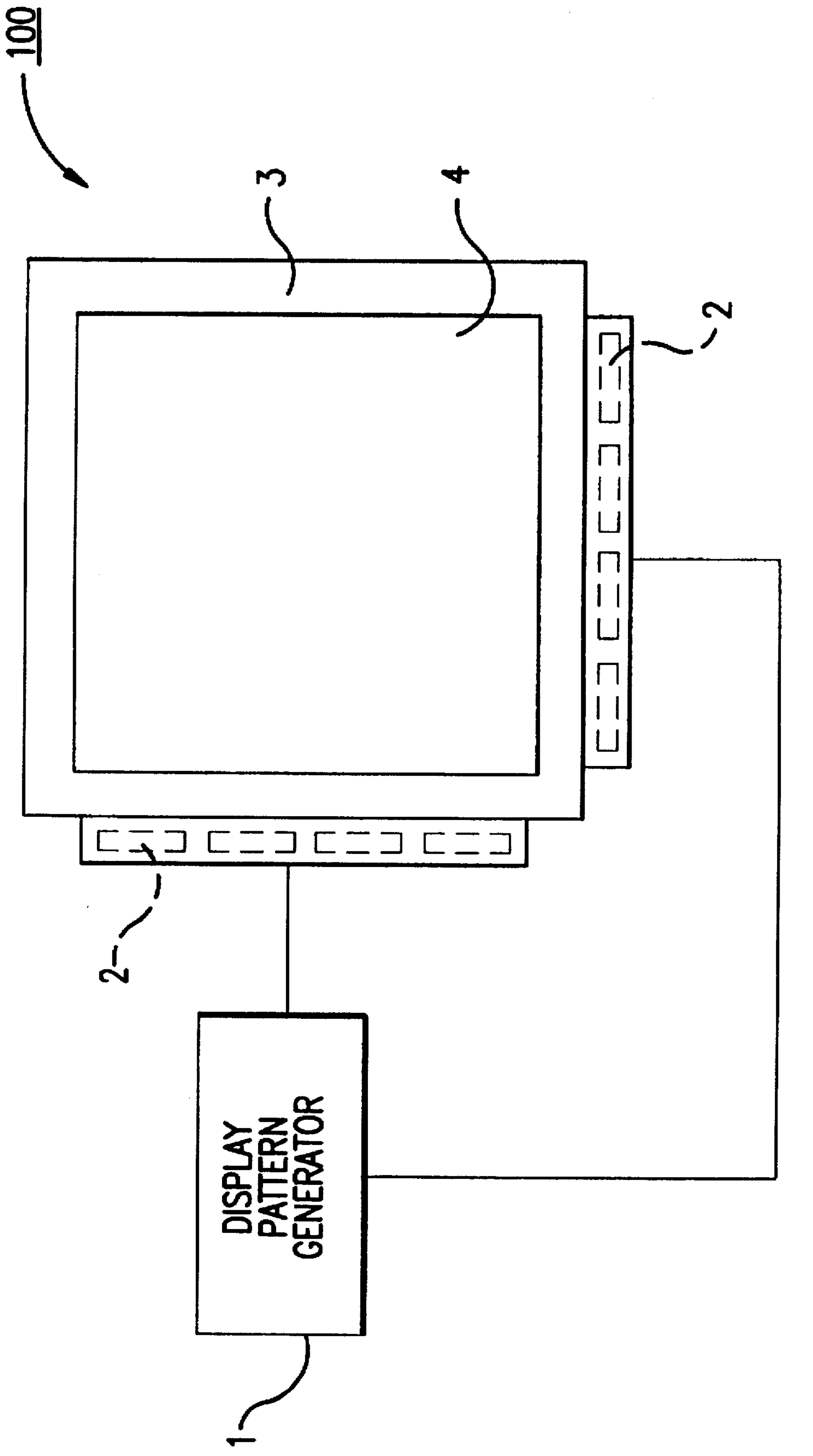
FIG. 1 shows a schematic view of an assembled liquid crystal display.

FIG. 1 shows a fully assembled active-matrix liquid crystal display 100. A display pattern generator 1 communicates with a plurality of driver chips 2. The driver chips 2 communicate with data lines and gate lines (not shown) formed on the display plate 3. The display pattern generator 1 activates individual display electrodes (not shown) via the data lines and the gate lines. Each display electrode corresponds to a pixel in the image produced by the display 100.

Figure 2:
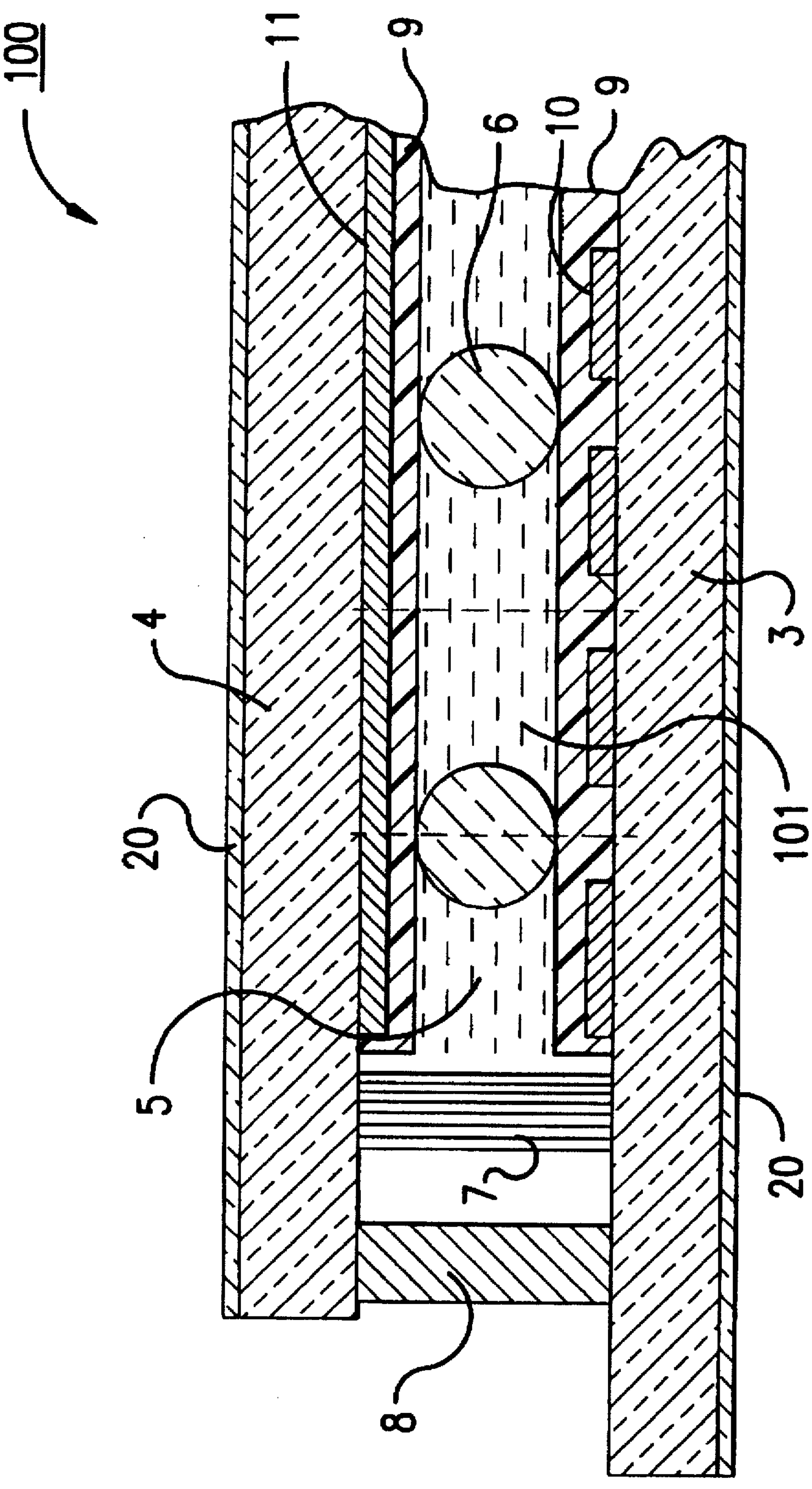
FIG. 2 shows a cross-sectional side view of an assembled liquid crystal display.

FIG. 2 shows a cross-sectional side view of a portion of the assembled liquid crystal display 100. The display plate 3 has a polarizing layer 20 formed on the lower surface of the display plate 3. Display electrodes 10 are formed on the upper surface of the display plate 3. Likewise, the cover plate 4 has a polarizing layer 20 formed on the upper surface of the cover plate 4. A continuous conducting electrode 11 is formed on the lower surface of the cover plate 4. The conducting electrode 11 and the display electrodes 10 are formed of a transparent conductor, typically indium tin oxide.

A first alignment layer 9 covers the display electrodes 10 and a second alignment layer 9 covers the conducting electrode 11. The alignment layers 9 serve to preferentially align the liquid crystal material 5 which is sandwiched between the display plate 3 and the cover plate 4, as will be discussed more fully below. The display plate 3 and the cover plate 4 are spaced apart by spacing elements 6. The spacing elements 6 ensure that a uniform spacing is maintained between the display plate 3 and the cover plate 4. A seal 7 seals the edges of the cover plate 4 to the edges of the display plate 3. The liquid crystal material 5 is trapped between the display plate 3 and the cover plate 4 and the seal 7. The cover sheet contact 8 maintains the uniform spacing between the display plate 3 and the cover plate 4 around the periphery of the cover plate 4 and structurally connects the display plate 3 to the cover plate 4.

The space between each display electrode 10 and the conducting electrode 11 is called a cell 101. Each cell 101 in the liquid crystal display 100 acts as a pixel in the image displayed by the display 100 and can be put into a light transmissive state or a light blocking state depending on the voltage potential between the display electrode 10 and the conducting electrode 11.

Figure 4:
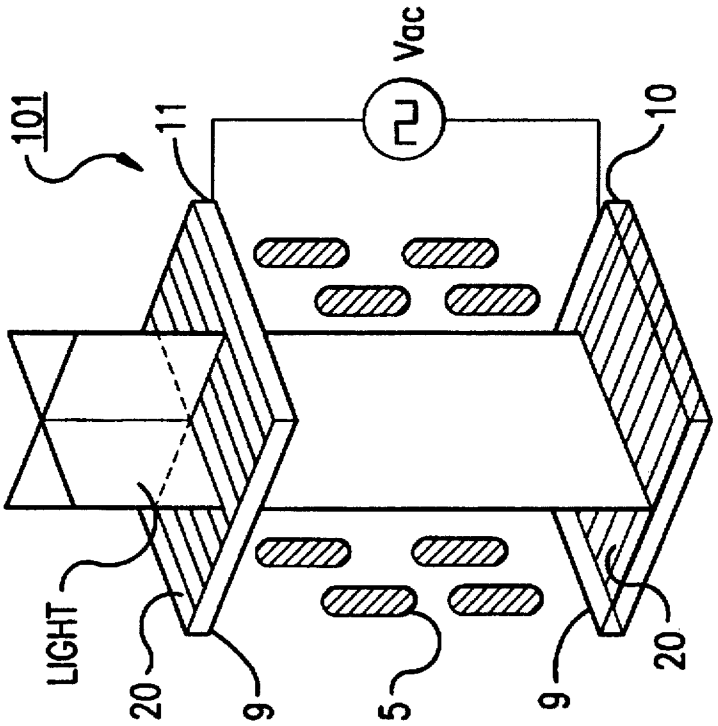
FIGS. 3 and 4 show how a nematic liquid crystal cell polarizes light in response to a voltage potential.
Figure 3:
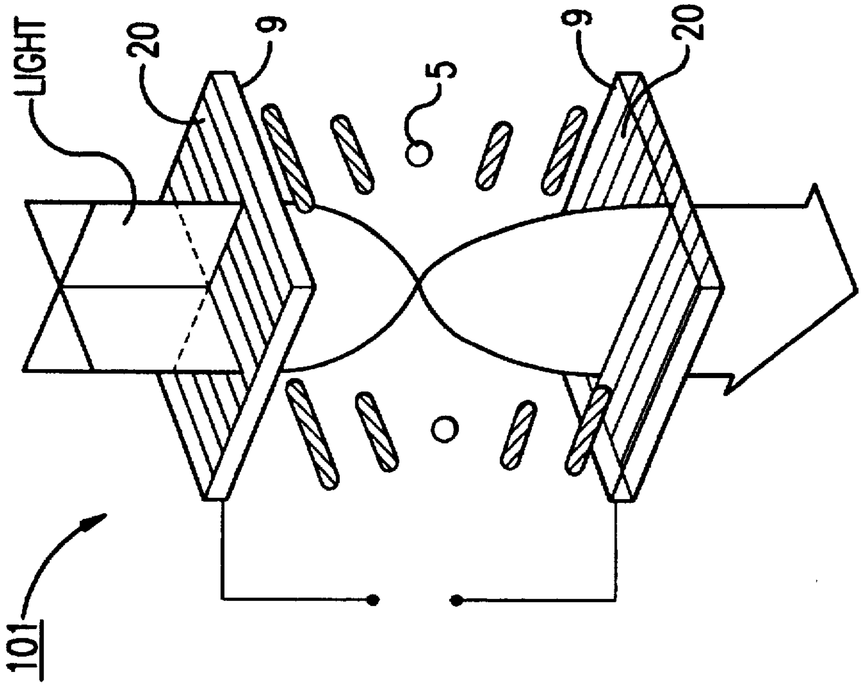

FIGS. 3 and 4 show how a cell 101 can be made either light transmitting or light blocking. In FIG. 3, unpolarized light impinges on the upper polarizing layer 20 of the cell 101. Only properly polarized light passes through the upper polarizing layer 20 into the liquid crystal material 5. Fine scratches or other directional features formed on the surface of the aligning layers 9 nearest the liquid crystal material 5 cause the molecules in the liquid crystal material 5 to align with the scratches. Normally, the scratches made on the aligning layers 9 are parallel to the polarizing grid lines in the polarizing layers 20.

The lower polarizing layer 20 transmits light polarized at an angle 90° to the upper polarizing layer 20. Likewise, the scratches formed on the lower aligning layer 9 are formed at an angle 90° to the scratches formed on the upper aligning layer 9. This causes the molecules in the liquid crystal material 5 of the cell 101 to be twisted 90° in alignment between the upper alignment layer 9 and the lower alignment layer 9. This twist in alignment of the molecules in the liquid crystal material 5 of the cell 101 rotates the polarization of the light 90° as the light passes through the liquid crystal material 5, as shown in FIG. 3. The rotation in the polarization of the light allows the light to pass through the lower polarization layer 20. Therefore, the cell 101 in FIG. 3 is in a light transmissive state.

However, when a voltage potential is introduced across the cell 101 between the display electrode 10 and the conducting electrode 11, the molecules in the liquid crystal material 5 align with the electric field lines, as shown in FIG. 4. Since the light entering the cell into the liquid crystal material 5 is not rotated 90° in polarity, the light does not pass through the lower polarization layer 20. Therefore, the cell 101 shown in FIG. 4 is in a light blocking state.

Figure 5:
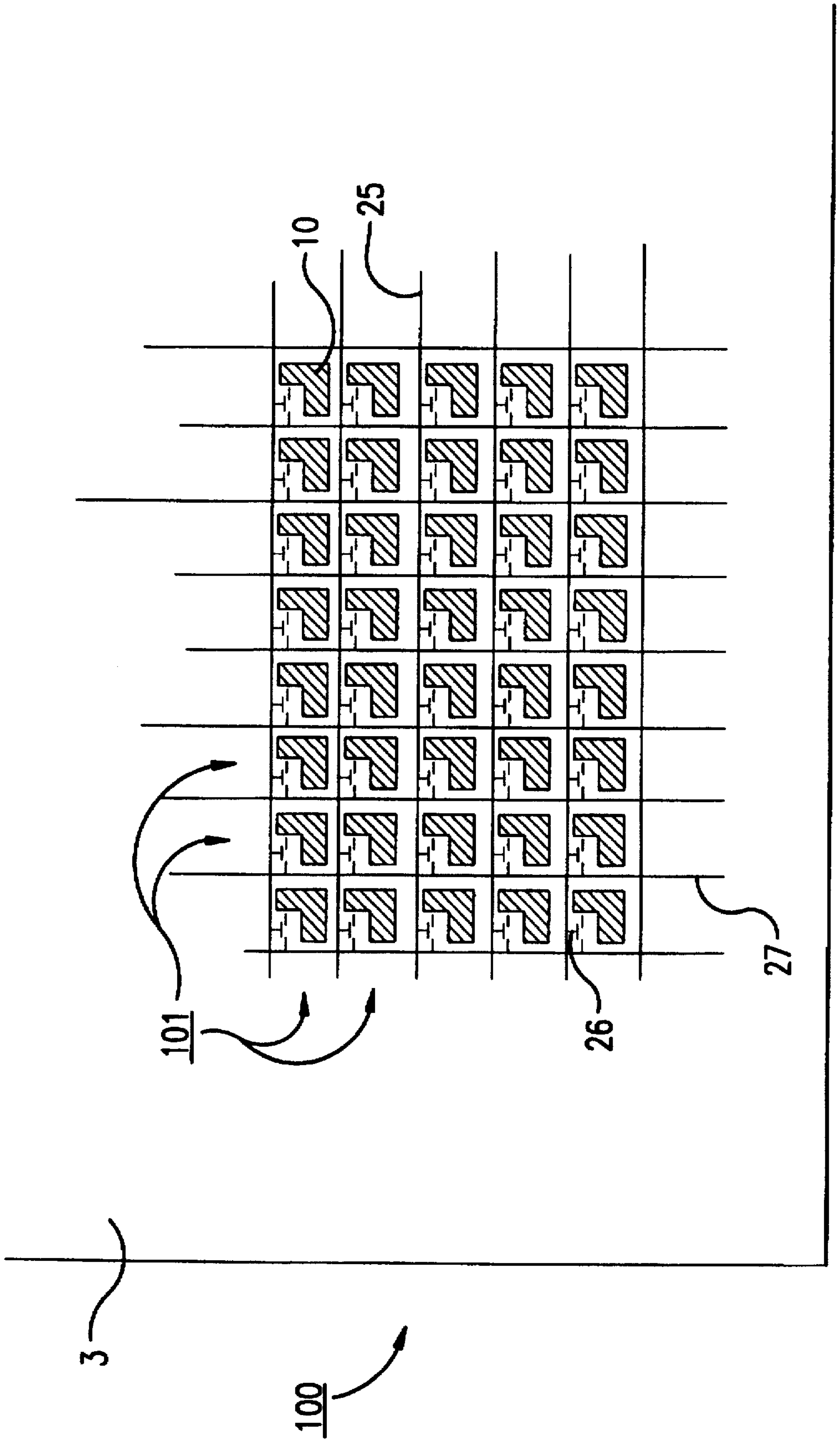
FIG. 5 shows a matrix of switches and display electrodes and corresponding data and gate lines.

FIG. 5 shows how the display electrodes 10 are formed in a matrix on the display plate 3. Each display electrode 10 corresponds to one cell 101. The gate lines 25 communicate with switches 26 associated with each display electrode 10 in a row of display electrodes 10. The switches 26 are typically thin-film silicon field-effect transistors. The data lines 27 are connected to the switch 26 associated with each display electrode 10 in a column of display electrodes 10. By appropriately activating the gate lines 25 and the data lines 27, the switches 26 for individual display electrodes 10 can be addressed and a charge placed on the display electrode 10. By placing a charge on the display electrode 10, an electric potential is introduced across the cell 101 associated with the display electrode 10, making the cell 101 light blocking. The display electrodes 10 which are not addressed introduce no voltage potential in the associated cell 101. Therefore, the cells 101 corresponding to the unaddressed display electrodes 10 are light transmissive.

It should be appreciated that the above description of the liquid crystal display 100 in the preferred embodiment of the invention is merely exemplary. Alternate methods of addressing the individual cells 101 are possible and different types of liquid crystal material can be used. The cells 101 could also be made light transmissive when addressed, and light blocking when unaddressed by altering the alignment layers 9, the polarizing layers 20 or the type of liquid crystal material 5 used.

Assembling the liquid crystal display 100 shown in FIGS. 1 and 2 is a time-consuming and complicated process. Once the switches 26, the gate lines 25, the data lines 27 and the display electrodes 10 and the conducting electrode 11 are formed on the display plate 3 and the cover plate 4, respectively, the alignment layer 9 is applied over the display electrodes 10 and the conducting electrode 11. The alignment layers 9 are then buffed in the appropriate direction to produce the scratches or other directional features which align the liquid crystal molecules properly with respect to the polarizing layers 20.

Next, the seal 7, typically made of epoxy, and the cover sheet contact 8 are applied to the display plate 3. The spacing elements 6, typically glass rods of uniform diameter, are distributed on the surface of the alignment layer 9 on the display plate 3. The cover plate 4 is then aligned with the display plate 3 such that each display electrode 10 is properly aligned with the conducting electrode 11. When properly aligned, the cover plate 4 is pressed into contact with the cover sheet contact 8 and the seal 7, which is heated to permanently bond the cover plate 4 to the display plate 3. When the cover plate 4 and the display plate 3 are properly bonded together, the void created between the cover plate 4 and the display plate 3 by the spacing elements 6 is filled with the liquid crystal material 5. Finally, the polarizing layers 20 are applied to the cover plate 4 and the display plate 3.

Once fully assembled, the liquid crystal display 100 can be tested to determine if the display 100 operates properly. During testing, the liquid crystal display 100 is driven to display a test image. By viewing the image displayed by the liquid crystal display 100, an operator determines if the displayed image is sufficiently similar to the test image.

If the image displayed by the liquid crystal display 100 does not properly match the test image or meet a predetermined quality level, the liquid crystal display 100 is repaired. If the failure of the liquid crystal display 100 is due to faulty switches 26, display electrodes 10, gate lines 25 or data lines 27, the liquid crystal display 100 is disassembled and the faulty component identified and repaired. Once the repairs are completed, the liquid crystal display 100 is reassembled.

To avoid disassembling the liquid crystal display 100 to repair one or more of the switches 26, the display electrodes 10, the gate lines 25 or the data lines 27, pre-assembly continuity testing of the gate lines 25 and the data lines 27 can be performed. However, such testing is time consuming because of the large numbers of the switches 26, the display electrodes 10, the gate lines 25 and the data lines 27 on a display. For example, a liquid crystal display 100 having a 13 inch diagonal measurement can have over 6 million display electrodes 10. Also, continuity testing does not test each display electrode 10 in a driven state. As discussed above, a device is available which tests the operation of the display electrodes 10 in the driven state. This device is expensive and operates in a complex manner. Therefore, an automated device which is relatively inexpensive and tests all of the display electrodes 10 on a display plate 3 before the liquid crystal display 100 is assembled is needed.

Figure 6:
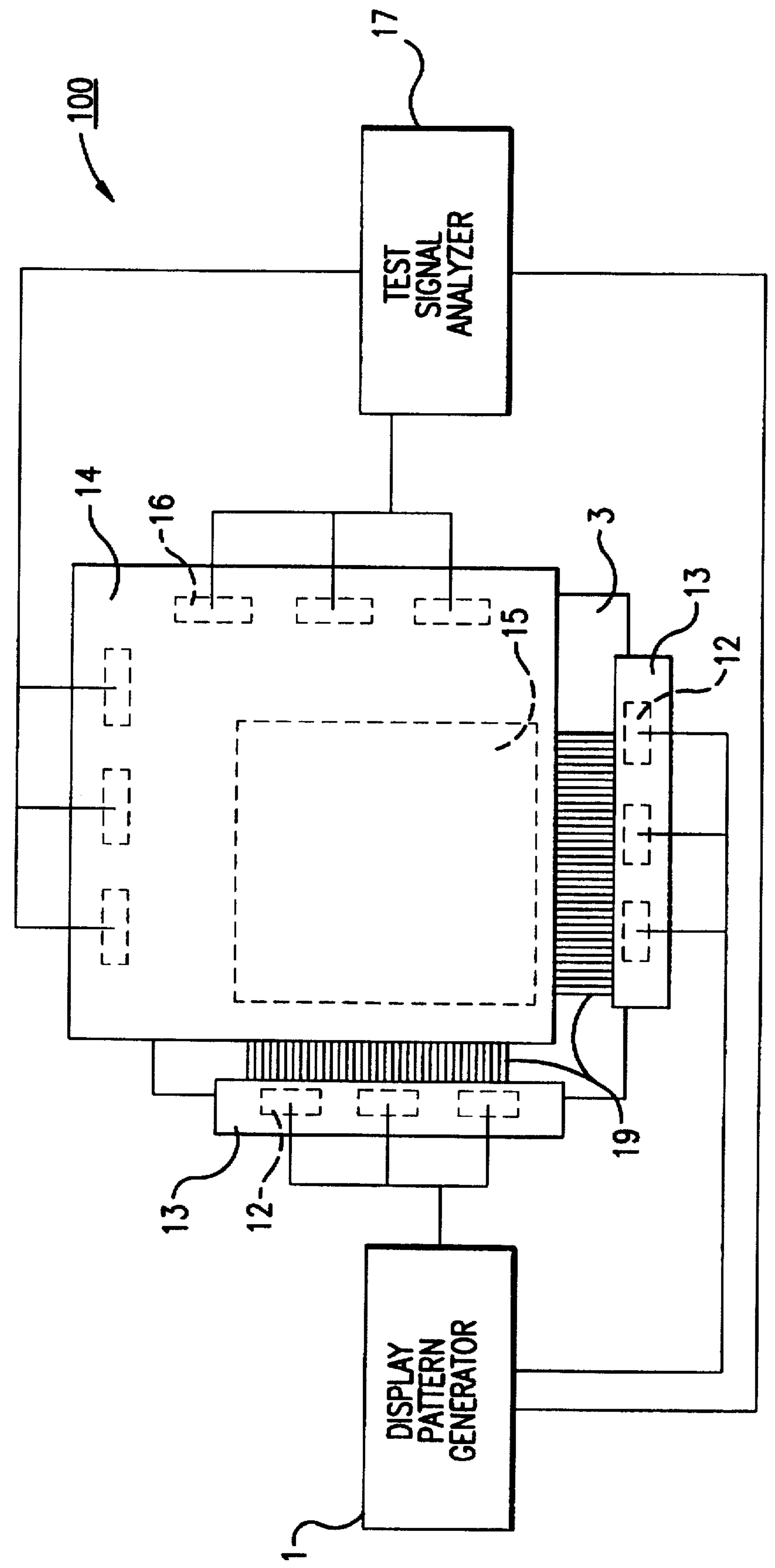
FIG. 6 shows a schematic of a preferred embodiment of the invention for testing the switches and display electrodes on a display plate.

FIG. 6 shows a testing device 102 for testing the switches 26, the display electrodes 10, the gate lines 25 and the data lines 27 on the display plate 3 before the liquid crystal display 100 is fully assembled. A display pattern generator 1 communicates with the driver chips 12 mounted on the full-width probe cards 13. The probe cards 13 provide temporary electrical contact between the driver chips 12 and the gate and data lines 19 leading out to the edges of the display plate 3. The full-width probe cards 13 can be standard probe cards as are known in the probing art, or probe cards having spring contacts in place of standard probe needles, as disclosed in the commonly assigned U.S. application Ser. No. JAO 34,052 filed concurrently herewith and herein incorporated by reference.

Communication between the driver chips 12 and the gate and data lines 19 allows the display pattern generator 1 to drive the display electrodes 10 in the display matrix area 15. In other words, the display generator 1 places electric charges on selected display electrodes 10 in accordance with a test image. If the display plate 3 were fully assembled with the cover plate 4 and the liquid crystal material 5 and other components, the charges placed on the display electrodes 10 would cause the test image to appear on the display. However, since the display plate 3 is not assembled into an operational liquid crystal display 100, the charges placed on each of the display electrodes 10 only correspond to pixels within the test image. No actual image visible to the human eye is produced by the display plate 3 during testing.

Figure 7:
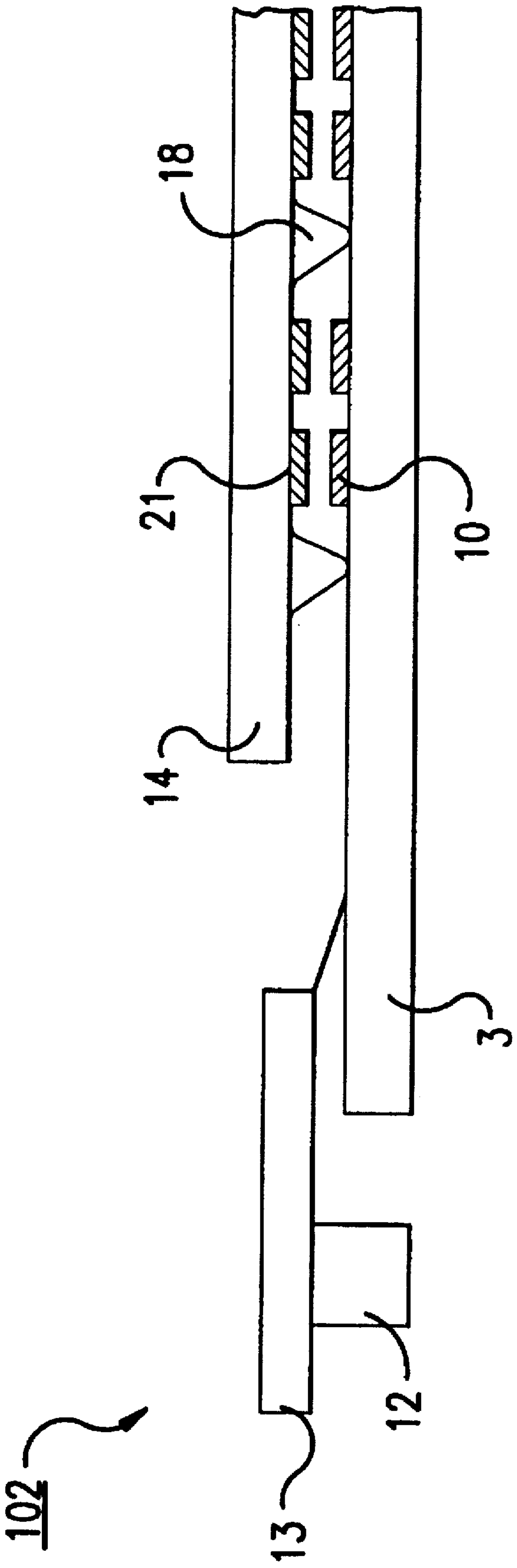
FIG. 7 shows a sectional side view of a preferred embodiment of the invention for testing a display plate.

A test plate 14 is aligned with and placed on top of the display plate 3. As shown in FIG. 7, charge-sensing electrodes 21 are formed on the lower surface of the test plate 14 and are each aligned with a corresponding display electrode 10. Spacing between each charge-sensing electrode 21 and its corresponding display electrode 10 is maintained by spacer bumps 18 formed on the test plate 14, although it may not be necessary to use the spacer bumps 18. The spacer bumps 18 ensure uniform spacing between the test plate 14 and the display 3 within the display matrix area 15. The charge-sensing electrodes 21 and the display electrodes 10 are spaced such that each charge-sensing electrode 21 is capacitively coupled to its corresponding display electrode 10. Therefore, when a charge is placed on a display electrode 10, a charge is capacitively induced in the corresponding charge-sensing electrode 21 in accordance with well-known electrostatic principles. Spacing between the charge-sensing electrodes 21 and the display electrodes 10 is maintained at approximately 2–10 microns to ensure proper capacitive coupling. The spacing can also be as large as the width of the display electrode 10 or the diameter of the pixel, or cell 101.

Alternately, the charge-sensing electrodes 21 can detect electric fields, magnetic fields, electric flux, magnetic flux or any other electromagnetic phenomena generated by the display electrodes 10. Thus, this invention can be based on any type of electromagnetic coupling, including electrical, magnetic or optical coupling.

The charge-sensing electrodes 21 and the spacer bumps 18 are formed on the test plate 14 by standard techniques well-known in the art. For example, the charge-sensing electrodes 21 can be formed of a conductive metal layer, such as aluminum, which is sputter deposited on the test plate 14, which is made of an insulating substrate such as glass. The spacer bumps 18 are formed of an insulating material, such as silicon oxynitride, which is deposited and etched into the desired shapes. The spacer bumps 18 can also be deposited using a shadow mask, which allows deposition of material only in a desired location.

Each charge-sensing electrode 21 communicates with a scanner chip 16, which communicates with the test signal analyzer 17, as shown in FIG. 6. The charge-sensing electrodes 21 and the scanner chips 16 are typically interconnected using an array of switches addressed by gate and data lines similar to those on the display plate 3. The scanner chips 16 read out the charge, if any, induced on each of the charge-sensing electrodes 21 by its corresponding display electrode 10 using standard scanning techniques. The test signal analyzer 17 uses the charges read out by the scanner chips 16 to generate a sensed image, in which the charge induced on each of the charge-sensing electrodes 21 corresponds to a pixel in a sensed image. For example, charge-sensing electrodes 21 which have a charge on them could correspond to an "on" pixel in the sensed image and those charge-sensing electrodes 21 having no charge on them could correspond to an "off" pixel in the sensed image.

Once the test signal analyzer 17 generates the sensed image, the test signal analyzer 17 compares the test image output by the display pattern generator 1 to the sensed image. By this comparison, the test signal analyzer 17 can identify those switches 26, display electrodes 10, gate lines 25 and/or data lines 27 which are faulty or otherwise not operational. Those display electrodes 10 or gate and data lines 19 which are identified as faulty can be easily repaired since full assembly of the liquid crystal display 100 is not yet complete. Repairs made to the failed components can be tested by testing the display plate 3 once again as described above.

It should be appreciated that the test signal analyzer 17 can take many forms. The test signal analyzer 17 could simply be a display screen which displays the sensed image sensed by the charge-sensing electrodes 21. An operator, who is familiar with the test image output by the display pattern generator 1, can view the sensed image on the test signal analyzer 17 to determine if the sensed image is sufficiently similar to the test image. The test signal analyzer 17 can also be a set of hard-wired circuits which compare pixels from the sensed image to the pixels in the test image and activate an indicator, such as a light-emitting diode, corresponding to the non-operational display electrode 10. Further, the test signal analyzer 17 can be a software module in a standard computer which compares the test image to the sensed image and outputs a list of faulty display electrodes 10 or otherwise indicates the faulty display electrodes 10.

It should also be appreciated that the testing device 102 can be used to test the operation of displays which operate on principles similar to that of the liquid crystal display. For example, the invention can be used to test the components on electroluminescent panels. The charge-sensing electrodes 21 can also be replaced with other sensing devices or even devices which generate electric or other signals to enable testing of other types of devices. For example, the charge-sensing electrodes 21 can be replaced with light-emitting elements to test an array of photosensors. The test signal analyzer 17 and the scanner chips 16 would be replaced with a device for selectively driving each of the light-emitting elements. The array of light-emitting elements are coupled to the array of photosensors in a manner similar to that described above. The array of light-emitting elements is then driven to emit light in a predetermined pattern and the pattern sensed by the array of photosensors is compared to the predetermined pattern. Comparison of the emitted pattern to the sensed pattern allows identification of faulty photosensors.

While the invention has been described in connection with the preferred embodiment, the description is not intended to limit the invention to the embodiments. On the contrary, it is intended to cover all alternatives, modifications and equivalents that may be included within the spirit and scope of the invention as defined by the appended claims.

What is claimed is:

1. A method of testing a display device having a plurality of display elements formed in a matrix, the method comprising the steps of:

placing each of a plurality of test sensors formed on a test plate within sufficient proximity to electromagnetically couple to a corresponding one of the plurality of display elements on the display device without electrically contacting the display elements;

aligning each of the plurality of test sensors with the corresponding one of the plurality of display elements;

controlling the display device such that selected ones of the plurality of display elements output a signal, the signal output by each of the plurality of display elements corresponding to a pixel in a test image;

determining which of the plurality of test sensors detects the signal output by the corresponding one of the plurality of display elements, the signal sensed by each of the plurality of test sensors corresponding to a pixel in the sensed image;

comparing pixels in the sensed image to corresponding pixels in the test image; and determining if sufficient similarity exists between the sensed image and the test image.

2. The method of claim 1, further comprising the step of:

bringing spacer elements on the test plate into contact with said display device to ensure uniform spacing between each of the plurality of test sensors and the corresponding one of the plurality of display elements.

3. The method of claim 1, further comprising the steps of:

inducing an electric charge at each of the plurality of test sensors in response to the output of signals from the corresponding one of the plurality of display elements; and reading out the charge induced at each of the plurality of test sensors.

4. The method of claim 1, wherein each test sensor is capacitively coupled to the corresponding display element.

5. A method of testing a matrix device having a plurality of matrix elements formed in a matrix, the method comprising the steps of:

placing each of a plurality of test elements of a test device within sufficient proximity to couple to a corresponding one of the plurality of matrix elements without electrically contacting the matrix elements;

controlling the matrix device and the test device such that selected ones of the matrix elements and the test elements output a signal, the signal output by each of the selected elements corresponding to a pixel in a test image, and such that matrix elements and test elements corresponding to the selected elements detect the signals output by the selected elements, each detected signal corresponding to a pixel in a sensed image;

comparing pixels in the sensed image to the corresponding pixels in the test image; and determining if sufficient similarity exists between the sensed image and the test image.

6. The method of claim 5, wherein each matrix element is capacitively coupled to the corresponding test element.

* * * * *